United States Patent [19]

Miller et al.

[11] Patent Number: 4,536,783
[45] Date of Patent: Aug. 20, 1985

[54] HIGH DI/DT, LIGHT-TRIGGERED THYRISTOR WITH ETCHED MOAT CURRENT LIMITING RESISTORS

[75] Inventors: Donald L. Miller, Penn Township, Westmoreland County; John X. Przybysz, Penn Hills Township, Allegheny County, both of Pa.

[73] Assignee: Westinghouse Electric Corp., Pittsburgh, Pa.

[21] Appl. No.: 550,849

[22] Filed: Nov. 14, 1983

[51] Int. Cl.³ .............................................. H01L 29/74
[52] U.S. Cl. ...................................... 357/38; 357/30; 357/55; 357/86; 357/51
[58] Field of Search ........................ 357/38, 55, 51, 30, 357/86

[56] References Cited

U.S. PATENT DOCUMENTS 3,943,548  3/1976  Terasawa ................................ 357/55
3,968,512  7/1976  Voss ...................................... 357/38
3,995,305  11/1976  Voss ...................................... 357/38
4,016,592  4/1977  Yatsuo et al. ........................ 357/30
4,142,201  2/1979  Sittig et al. .......................... 357/30

OTHER PUBLICATIONS

A. Tada et al., "4 Kv, 1500L-T Thyrs.," Jap. J.A.P., Supplement, 20-1, pp. 99–104, 1981.
V. Temple, "Controlled Thyrs. . . . ", IEEE 1981 IEDM Tech. Digest, pp. 406–409, 1981.

Primary Examiner—Joseph E. Clawson, Jr.
Attorney, Agent, or Firm—C. L. Menzemer

[57] ABSTRACT

The present invention is directed to a light-triggered thyristor having a high di/dt, high dv/dt, and high photosensitivity. The thyristor has a three-stage cathode emitter gating structure with integrated current limiting resistors. The current limiting resistors are defined by moats etched in the cathode base region. The moats also cause a "turn-on" current to flow through substantially all of the cathode base region.

8 Claims, 4 Drawing Figures

HIGH DI/DT, LIGHT-TRIGGERED THYRISTOR WITH ETCHED MOAT CURRENT LIMITING RESISTORS

BACKGROUND OF THE INVENTION

1. Field of the Invention

The present invention is in the field of solid-state devices generally and is directed specifically to a light-triggered thyristor.

2. Description of the Prior Art

The most relevant prior art known is as follows:

(1) Directly Light-Fired Thyristors with High di/dt Capability, V.A.K. Temple, IEEE 1977 IEDM Technical Digest, Washington, D.C., Pg. 22 (1977).

(2) 4 KV, 1500 A Light-Triggered Thyristor, A. Tada, A. Kawakami, T. Miyazima, T. Nakagawa, K. Yamanaka and K. Ohtaki, Japanese Journal of Applied Physics, 20 Supplement 20-1, Pg. 99 (1981).

(3) A High Voltage, High Current Light-Activated Thyristor with a New Light Sensitive Structure, O. Hashimoto and Y. Sato, IEEE 1981 PESC Record, Boulder, Colo., Pg. 226 (1981).

(4) Controlled Thristor Turn-On for High di/dt Capability. V.A.K. Temple, IEEE 1981 IEDM Technical Digest, Washington, D.C., Pg. 406 (1981).

The first three references teach the use of moats to direct the photocurrent, however none of the three teach the use of moats to form current limiting resistors.

The fourth reference teaches the use of annular rings to form current limiting resistors, however the current limiting resistors are not in a parallel circuit relationship.

Further, none of the four references teach forming interstage resistors by directing or channeling the "turn-on" current between moats as is practiced in the present invention.

SUMMARY OF THE INVENTION

The present invention is directed to a light-triggered or light-fired thyristor, having a top and a bottom surface with an edge portion extending therebetween, the thyristor being comprised of a first auxiliary cathode emitter region, a second auxiliary cathode emitter region, a main cathode emitter region, a cathode base region, an anode base region and an anode emitter region with a p-n junction between adjacent regions. An optical well disposed in a central portion of the top surface of said thyristor and extending into only said cathode base region. Three moats disposed in the top surface of the thyristor about, and spaced apart from said optical well and extending into said cathode base region, the moats defining, within the cathode base region, two current limiting electrical resistors, each of the two current limiting resistors being comprised of two electrical resistors functioning electrically as two resistors electrically connected in a parallel circuit relationship.

BRIEF DESCRIPTION OF THE DRAWINGS

For a better understanding of the present invention reference should be had to the following detailed description and drawing in which.

DESCRIPTION OF THE PREFERRED EMBODIMENT

Figure 1:
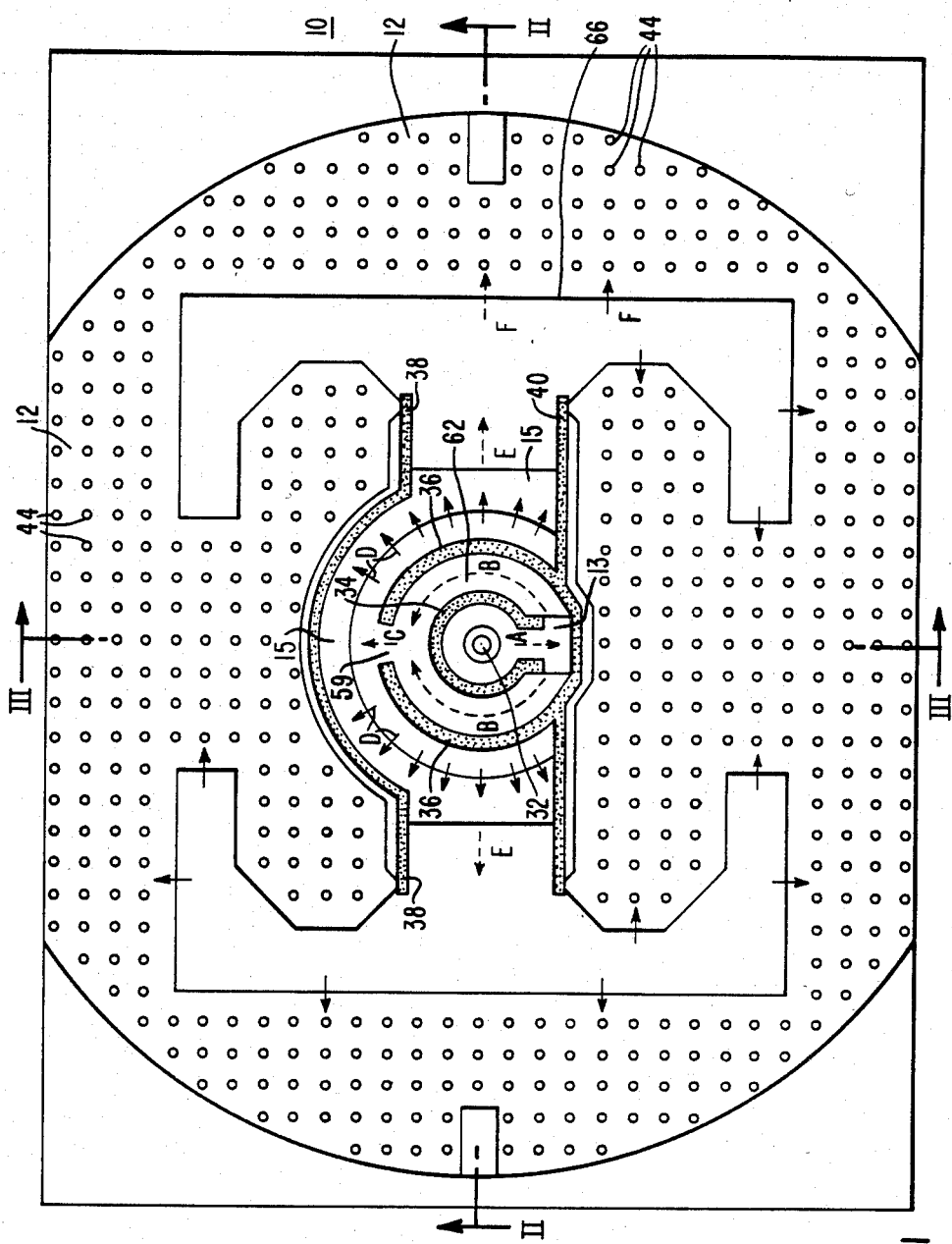
FIG. 1 is a top view of a light-triggered thyristor embodying the teachings of the present invention.

Light-triggered thyristors, commonly designated LTT or $LT^2$, offer the user the distinct advantage of complete electrical isolation of the gating circuit.

The light triggered thyristor is fired by a light pulse which is delivered to the device through some suitable means such as an optical fiber or light pipe.

The source of the light for triggering the thyristor preferably is supplied by a laser or a light emitting diode (LED). The LED is preferred by many users due to its relative ease of application and reliability. The major shortcoming of the LED is its relatively low power.

A typical LED is capable of generating 2mA of photocurrent which can be utilized to trigger a thyristor.

The thyristor that can be triggered by a 2mA photocurrent would normally have a sensitivity that would make it susceptible to voltage rate of rise dv/dt triggering faults caused by the displacement current generated during the application of a voltage transient.

This type of problem might be alleviated by decreasing the physical size of the optical gate. This, however, would in turn make the thyristor susceptible to current rate of rise (di/dt) failures resulting from excessive local heating generated by large current densities in the gate.

Applicants have developed a gate geometry that provides an extremely light sensitive thyristor which has a high tolerance for both a high dv/dt and a high di/dt.

The thyristor of the present invention consists primarily of three emitter stages with integral resistors between successive emitter stages. In addition, moats are employed to channel current through all of the cathode base region during "turn-on".

For the purpose of clarity the invention will be described relative to a thyristor having the following operating characteristics.

$I_{GT} = 2$ mA $dv/dt_{min} = 2300$ V/$\mu$s $di/dt_{min} = 750$ A/$\mu$s $V_{DRM} = 4000$ V In general, in the thyristor of this invention, triggering light strikes an optical well and emitter regions disposed about the well on the top surface of the device. The optical gate, consisting of the optical well and the adjacent emitter regions, has a turn-on periphery of approximately 3 mm (3000 microns) and a cathode base region resistance of 600 ohms when the thyristor is biased at 12 volts.

The thyristor of this invention will "turn-on" at a bias ranging from 12 volts to 4000 volts.

At a bias of 12 volts, a first auxiliary cathode emitter turns on a second auxiliary cathode emitter and the second auxiliary cathode emitter turns on a main cathode emitter.

As the bias approaches or slightly exceeds 100 volts, up to the full rated bias of 4000 volts, the first auxiliary cathode emitter will turn on the main cathode emitter.

In the present device, "turn-on" occurs when the IR voltage drop under the first auxiliary emitter exceeds approximately 0.7 volts, 2 mA of photocurrent is more than adequate to trigger the first auxiliary emitter.

Similarly, the second auxiliary and the main cathode emitter, having shunt resistances of 27 ohms and 1.4 ohms respectively will trigger when their gate currents exceed 25 mA and 500 mA respectively.

The thyristor has two current limiting resistors designed to restrict current flow through the first and second auxiliary emitters.

The two current limiting resistors limit the switching losses of the first and second auxiliary emitters in two ways. First, they ensure early "turn-off" of the first and second auxiliary emitters by providing additional resistance to current flow which is not present in succeeding stages; and, secondly, they hold down forward drop in auxiliary emitters to the order of 10 volts by limiting the auxiliary emitter current density to less than 1000 A/cm$^2$.

The effective area of the first auxiliary cathode emitter is 0.032 cm$^2$. The effective area of the second auxiliary cathode is 0.15 cm$^2$.

The area of the first auxiliary cathode emitter is, therefore, large enough so that current density is kept below 1000 amps/cm$^2$ when the emitter area is fully "turned-on".

Under high bias conditions, approximately 100 volts, the second auxiliary cathode emitter is "turned-on" essentially simultaneously with the main cathode emitter. Therefore, the relationship $$V_{bias}/R_{current\ limiting}/Area \leq 1000\ A/cm^2$$

is not required for the second auxiliary cathode emitter at high bias conditions.

When the first auxiliary emitter is fired with the device biased at 12 volts, it is capable of delivering, to the second auxiliary emitter, a gating current of approximately 12 volts/200 ohms or 60 mA. This 60 mA will trigger the second auxiliary emitter, which will deliver to the main cathode emitter a gating current of approximately 12 volts/6 ohm or 2 A.

On the other hand, if the thyristor is biased at 4 kV, the photogate i.e., the first auxiliary cathode emitter is capable of delivering a gating current of approximately 4000 volts/200 ohms or 20 A. This provides the main cathode emitter with a gate current which is consistent with that which is generally accepted as sufficient for high di/dt applications, approximately 10 times minimum triggering current, and the second auxiliary emitter may be bypassed.

Reference is made to FIGS. 1, 2, 3 and 4 for the description of the light triggered thyristor of this invention and how the device functions.

Light triggered thyristor 10 can be formed on a silicon wafer having a diameter of 50.8 mm (2 inches) and a thickness of 35 mils (889.00 microns).

The thyristor 10 has a main cathode emitter region 12, a first auxiliary cathode emitter region 13 and a second auxiliary cathode emitter region 15. The cathode emitter regions 12, 13 and 15 are of n+ type conductivity, are preferably formed by diffusion, but may be formed by epitaxial growth or ion implementation, and are doped to a surface concentration of approximately 5×10$^{19}$ atoms/cc. The main cathode emitter region 12 and the first and second auxiliary cathode regions 13 and 15 have a depth of 15 microns (μm) (0.59 mils) measured from top surface 14 of the thyristor 10 to p-n junction 16.

There is a p+ type cathode base region 18 adjacent to the cathode emitter region 12. The cathode base region is preferably formed by diffusion and is doped to a surface concentration of from 5–10×10$^{17}$ atoms/cc. The cathode base region extends from a p-n junction to pn junction 16 in some areas and to top surface 14 of the thyristor in other areas. The depth of cathode base region 18 is 98.6 microns (3.88 mils) measured between pn junctions 16 and 20 and 113.6 microns (4.47 mils) when measured between pn junction 20 and top surface 14. It will be noted that the cathode emitter region 12 is shunted and that the cathode base region 18 extends to the top surface 14 of the thyristor 10 in the shunts.

There is an anode base region 22 adjacent to the cathode base region 18. The region is comprised of the original starting silicon wafer material and is n-type silicon having a resistivity of 220 ohm-cm and has a thickness of 660 microns (26 mils) as measured between p-n junction 20 and a p-n junction 24.

There is a p+-type anode emitter region 26 adjacent to the anode base region 22. The anode emitter region 26 is preferably formed by diffusion usually simultaneously with the formation of the cathode base region 18. The anode emitter region 26 is doped to a surface concentration level of from 5 to 10×10$^{17}$ atoms/cc and has a depth of 115 microns (4.53 mils) as measured from p-n junction 24 to bottom surface 28 of thyristor 10.

There is a metal anode emitter electrode 30 affixed to bottom surface 28 of thyristor 10. The electrode 30 is in ohmic electrical contact with the anode emitter region 26. The electrode 30 is comprised of a metal selected from the group consisting of molybdenum, tungsten, tantalum and base alloys thereof. Preferably the electrode 30 is comprised of molybdenum.

There is an optical well 32 disposed in the center of the top surface 14 of the thyristor 10. The well 32 extends from top surface 14 of the thyristor into the cathode base region 18 and is contained only within the cathode base region 18. The well 32 has a diameter of 0.75 mm (30 mils) and a depth of from 50 to 90 microns, preferably 70 microns (2.76 mils).

Disposed within the top surface 14, and spaced apart from the optical well 32, are moats 34, 36, 38 and 40. The moats 34, 36, 38 and 40 extend from top surface 14 into the cathode base region 18 to a depth of 70 microns (2.76 mils). The moats 34, 36, 38 and 40 have a width or diameter of 508 microns (20 mils). The moats are laid out so that all of the cathode base region 18 conducts current during "turn-on" of the thyristor. The moats will be discussed further below.

A metal main cathode electrode 42 is affixed to top surface 14 of the thyristor 10 in ohmic electrical contact with the main cathode emitter region 12. The main cathode electrode 42 is also in ohmic electrical contact with cathode base region 18 where shunts 44 of cathode base region 18 extend to the top surface 14 of the thyristor 10 between areas of main cathode emitter region 12.

A metal electrode 46 is affixed on top surface 14 of thyristor 10 in ohmic electrical contact with first auxiliary emitter region 13 and cathode base region 18.

Another metal electrode 48 is affixed on top surface 14 of thyristor 10 in ohmic electrical contact with second auxiliary emitter region 15. The second auxiliary emitter electrode 48 is also in ohmic contact with the cathode base region 18 immediately adjacent to the second auxiliary emitter region 15.

There are also equipotential electrodes 50, 51, and 53 affixed to surface 14 of thyristor 10 in ohmic electrical contact with cathode base region 18. The equipotential electrodes 50, 51 and 53 serve to create equal potential for uniformity of current flow through the cathode base region 18.

The electrodes 42, 46, 48, 50, 51 and 53 are preferably of aluminum.

The thyristor 10 has an edge portion 52 which is double beveled and extends between top surface 14 and bottom surface 28 of the thyristor 10.

The edge portion 52 has a layer of a suitable passivation material 54, as for example an RTV silicone, disposed thereon.

A photocurrent is generated in the thyristor 10 by light energy, not shown, from a laser or an LED incident onto the walls 56 and bottom surface 58 of the optical well 32. Current flow is denoted by dotted lines in FIGS. 1, 2, 3 and 4.

The photocurrent "turns-on" the first auxiliary cathode 13 which in turn results in current flowing along path A, FIGS. 1, 2, 3 and 4.

Figure 2:
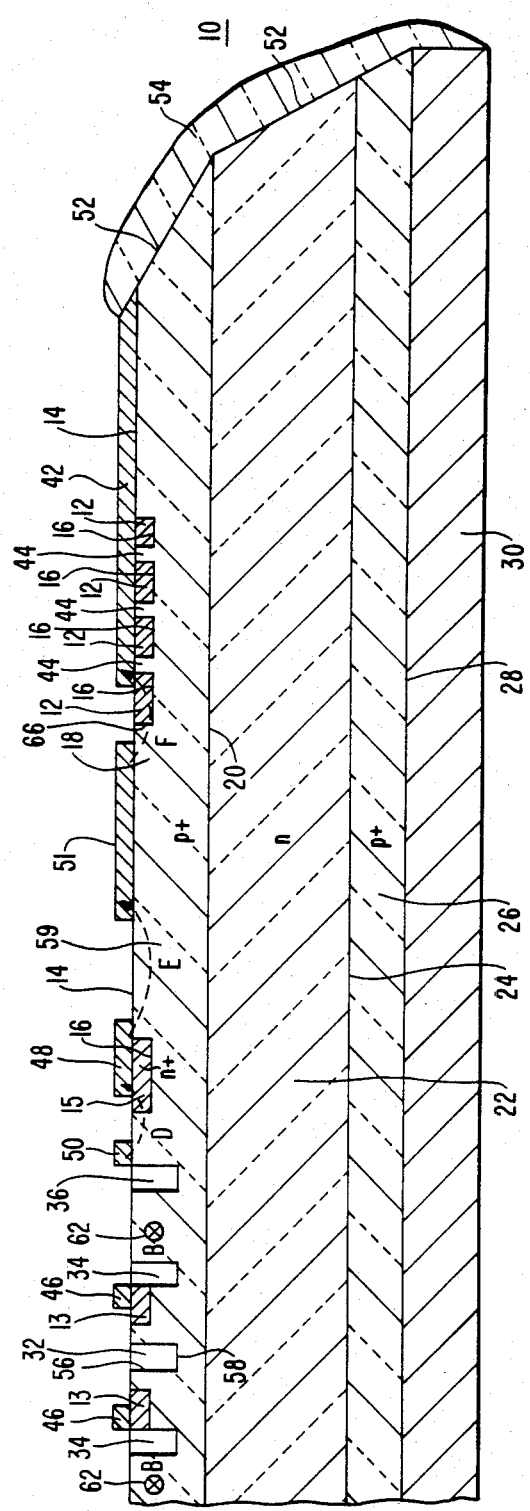
FIG. 2 is a sectional view of the thyristor of FIG. 1 taken along the line II—II of FIG. 1.

The current continues to flow along path A until moats 34 and 36 cause it to split and follow two electrically parallel pathways denoted as B in FIGS. 1, 2 and 4 through 400 ohm resistors electrically in parallel. In FIG. 2 the symbol ⊗ B is used to denote the current flowing into the device in a plane perpendicular to the plane of the figure.

Figure 3:
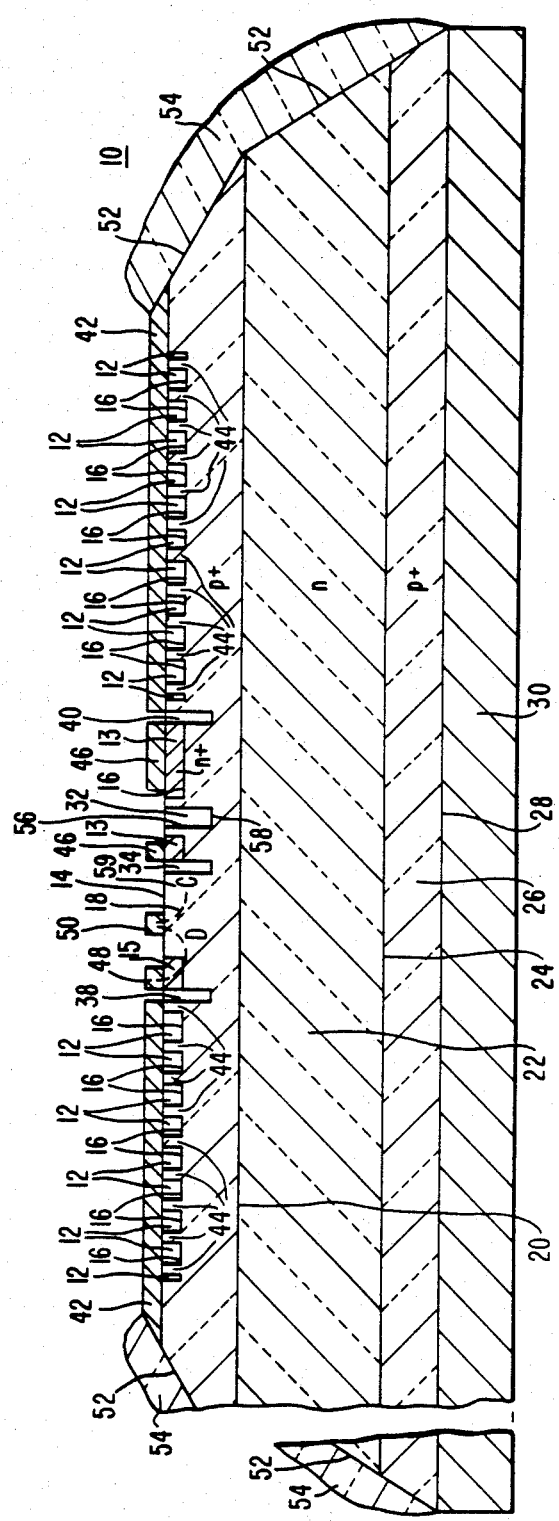
FIG. 3 is a sectional view of the thyristor taken along the line III—III of FIG. 1.
Figure 4:
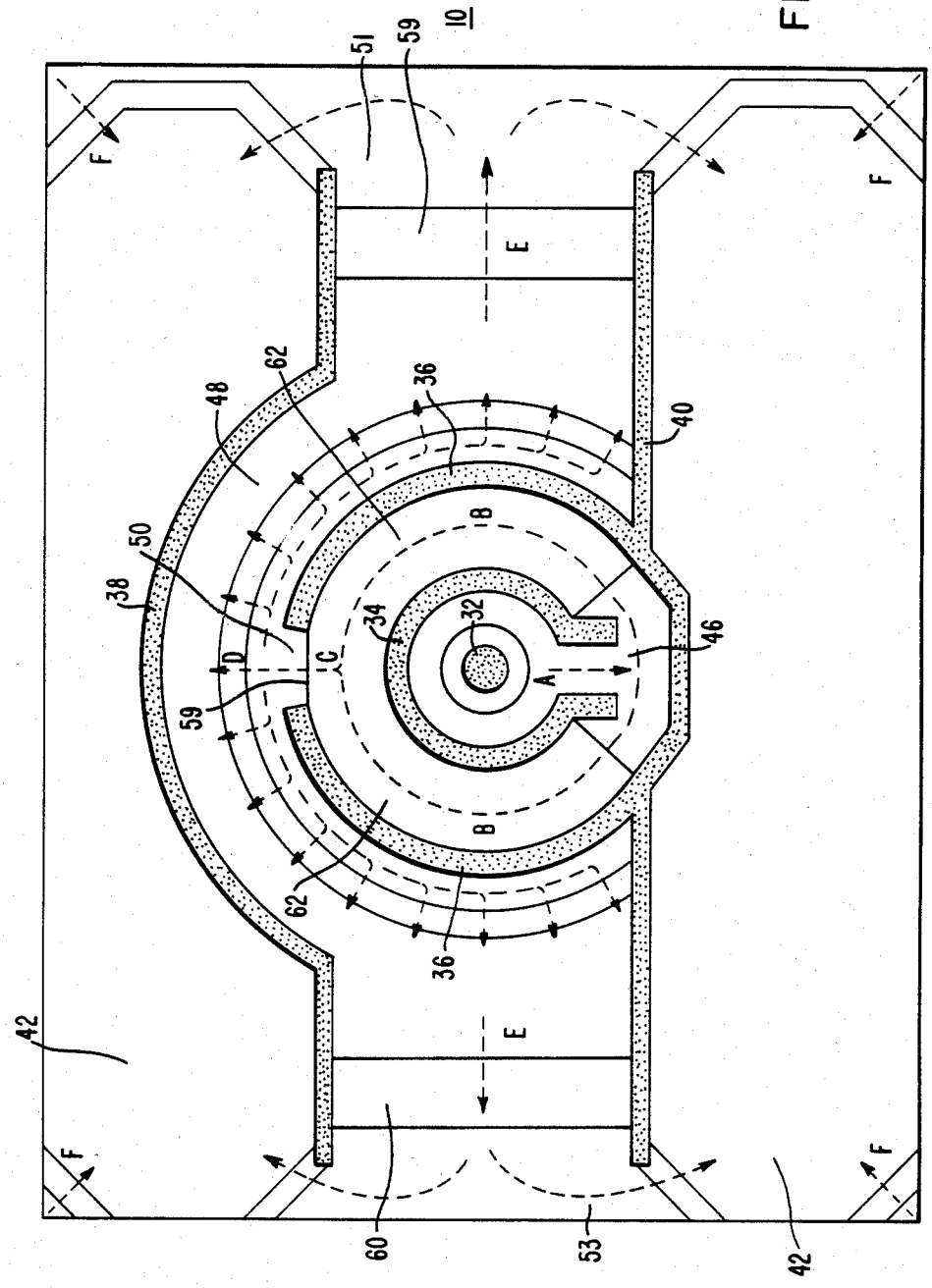
FIG. 4 is a top view of the central gate region of the thyristor of FIG. 1.

The current flow B recombines at C, point 59, in FIGS. 1, 3 and 4 as it enters electrode 50.

The current then flows from electrode 50 along path D into second auxiliary emitter 15 and then into electrode 48 shown in FIGS. 1, 2, 3 and 4.

The current flow path is then out of electrode 48 through two 12 ohm resistors effectively electrically in parallel denoted 59 and 60 in FIGS. 2 and 4 and into electrodes 51 and 53, respectively. This current flow is denoted as E in FIGS. 1, 2 and 4.

The two electrodes 51 and 53 are at the same potential thus resistors 59 and 60 share the current E equally and thus are functionally electrically in parallel.

If an electrical conductor, as for example a wire, of an electrically conductive material is used to electrically connect the electrodes 51 and 53, the resistors would in fact be connected electrically in a parallel circuit relationship. Such physical connection of the two electrodes would not alter the operation of the thyristor.

The current flow, denoted as F in FIGS. 1, 2 and 4 then flows out of electrodes 51 and 53 into the main cathode emitter 12 and then into the main cathode emitter electrode 42.

It will be noted that the current flows through all of the cathode base region 18 during "turn-on".

In conventionally known devices the first auxiliary cathode emitter fires the second auxiliary cathode emitter and then the main cathode emitter is fired. The output current of the first auxiliary cathode emitter flowing through current limiting resistors is inadequate to strongly trigger the main cathode emitter. Such a condition leads to a high "turn-on" loss in the thyristor.

In the present invention the current limiting resistors are designed to be small enough so that the output current of the first auxiliary cathode emitter can strongly trigger the main cathode emitter at high bias conditions. This leads to lower "turn-on" losses and higher di/dt capability because "turn-on" delay time associated with the second auxiliary cathode is bypassed.

In prior art thyristors, the current limiting resistors are designed with an annular geometry with the resistors having an inner and outer radius. The resistors are designed using the equation:

$$R = (R_s/2\pi) \ln \frac{R_o}{R_i}$$

where:
R = Resistance
$R_s$ = Sheet Resistance of the Cathode Base Region
$R_o$ = Outside Radius of the Resistor
$R_i$ = Inside Radius of the Resistor Because of the geometric considerations it is frequently necessary to etch away, by chemical etch, a portion of the cathode base region to increase the $R_s$ and thereby increase R. The chemical etch is most difficult to control within the physical constraints required and as a result the final resistance R is frequently only a rough approximation on the desired design value.

In the thyristor of this invention there are two current limiting resistors.

The first resistor, which limits currents through the first auxiliary cathode is a 200 ohm resistor actually comprised of two 400 ohm resistors in a parallel circuit relation designated as 62 in FIGS. 2 and 4.

The second resistor, which limits current through the second auxiliary cathode is a 6.25 ohm resistor actually comprised of two approximately 12 ohm resistors in a parallel circuit relation designated as 59 and 60 in FIGS. 2 and 4.

The resistors 60 and 62 in this invention are formed by using the moats to channel the current through the cathode base region 18.

The value of the resistors are computed using the formula:

$$R = R_s \frac{\text{Length of Channel}}{\text{Width of Channel}}$$

wherein:
R = Resistance
$R_s$ = Sheet Resistance of the Cathode Base Region

This method of forming current limiting resistors has the following advantages:

1. It is not necessary to chemically etch away the current limiting resistor portions of the cathode base region, and 2. The current flow is in only one direction as opposed to a 360 degree current flow in the prior art device resistors.

To explain how the current limiting resistors are designed in the present invention consider the 6 to 6.25 ohm current limiting resistor of the second auxiliary cathode emitter denoted 59 and 60 in FIGS. 2 and 4 which is made up of two 12 ohm resistors in a parallel circuit relationship.

The length of the resistor, the channel length, is the distance between electrodes 48 and 51 in FIGS. 2 and 4, 1 mm (1000 microns; 39.37 mils). The width of the resistor, the channel width, for each of the two resistors is 4 mm (4000 microns; 157.48 mils), the distance between moats 38 and 40 or a total effective width of 8000 microns (314.96 mils).

The sheet resistance of the p-type cathode base region is 50 ohms/□.

Referring to the equation:

$$R = 50 \times \tfrac{1}{8} = 6.25 \text{ ohms}$$

For the 200 ohm current limiting resistor, comprised of two 400 ohm resistors in a parallel circuit relationship, the length is 8 mm (8000 microns; 314.96 mils), the distance between electrodes 46 and 50 along path B in FIGS. 2 and 4 and the width of each resistor is 1 mm (1000 microns; 39.37 mils), the distance between moats 34 and 36. The sheet resistance is again 50 ohm/□.

Referring to the equation:

$$R = 50 \times (8/2=)200 \text{ ohms}$$

There are also shunt resistors in the device of the present invention, as there are in prior art devices. The shunt resistances result from electrical shunting or electrically shorting the cathode emitter regions with the cathode base regions through the emitter electrodes.

The shunt resistors control certain electrical parameters of the thyristors.

In the present device the first auxiliary emitter total cathode shunt resistance is 600 ohms and this provides an $I_{GT}$ of less than 2 mA.

The second auxiliary emitter total cathode shunt resistance is 27 ohms and provides an $I_{GT}$ of less than 60 mA.

The main cathode emitter has shunts 279.4 microns (11 mils) in diameter spaced 889 microns (35 mils) apart and 889 microns (35 mils) from edge 66. This spacing provides effectively 100 shunts in a parallel electrical circuit for a total resistance of 1.4 ohms. This shunt pattern results in the device having a dv/dt of 2300 volts/$\mu$ sec and the length of the "turn-on" line, edge 66, results in a di/dt of 750 amps/$\mu$ sec.

We claim as our invention:

1. A light-triggered thyristor having a top surface, a bottom surface and an end portion extending therebetween, the thyristor being comprised of a first auxiliary cathode emitter region, a second auxiliary cathode emitter region, a main cathode emitter region, a cathode base region, an anode base region and an anode emitter region, a p-n junction between adjacent regions, an optical well disposed in a central portion of the top surface of the thyristor and extending into only said cathode base region, three moats disposed in the top surface of the thyristor disposed about and spaced apart from said optical well, said moats each extending only into said cathode base region, said moats defining, within said cathode base region two current limiting resistors.

2. The thyristor of claim 1 in which each of said current limiting resistors is comprised of two electrical resistors connected in a parallel circuit relationship.

3. The thyristor of claim 1 in which each of said current limiting resistors is comprised of two electrical resistors connected functionally in a parallel circuit relationship.

4. The thyristor of claim 3 in which one of said current limiting resistors is disposed electrically between the first auxiliary cathode emitter region and the second auxiliary cathode emitter region and the other current limiting resistor is disposed electrically between the second auxiliary cathode emitter region and the main cathode emitter region.

5. The thyristor of claim 4 in which the current limiting resistor disposed electrically between the first auxiliary cathode emitter region and the second auxiliary cathode emitter region is comprised of two electrical resistors connected in a parallel circuit relationship and the current limiting resistor disposed electrically between the second auxiliary cathode emitter region and the main cathode emitter region is comprised of two electrical resistors connected functionally in a parallel circuit relationship.

6. The thyristor of claim 4 in which the current limiting resistor disposed electrically between the first auxiliary cathode emitter region and the second auxiliary cathode emitter region is of a higher ohmic resistance value than the current limiting resistor disposed electrically between the second auxiliary cathode emitter region and the main cathode emitter region.

7. The thyristor of claim 1 in which, at full rated bias, the first auxiliary cathode emitter region will turn on the main cathode emitter region.

8. The thyristor of claim 1 in which the first auxiliary cathode emitter region is of such an effective area that current density is less than 1000 amps/cm$^2$ when the first auxiliary cathode emitter region is fully on.

* * * * *